(12) United States Patent
Hwang et al.

(10) Patent No.: US 9,455,165 B2
(45) Date of Patent: Sep. 27, 2016

(54) DIE BONDING DEVICE

(71) Applicant: Samsung Electronics Co., Ltd., Suwon-si, Gyeonggi-do (KR)

(72) Inventors: Yisung Hwang, Asan-si (KR); Sugil Lee, Asan-si (KR); Dongjun Kim, Asan-si (KR); Yongdae Ha, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/660,093

(22) Filed: Mar. 17, 2015

(65) Prior Publication Data
US 2015/0303081 A1    Oct. 22, 2015

(30) Foreign Application Priority Data

Apr. 16, 2014 (KR) .................. 10-2014-0045560

(51) Int. Cl.
*H01L 21/67* (2006.01)
*H01L 21/677* (2006.01)
*H01L 21/687* (2006.01)

(52) U.S. Cl.
CPC ... *H01L 21/67132* (2013.01); *H01L 21/67144* (2013.01); *H01L 21/67703* (2013.01); *H01L 21/68714* (2013.01)

(58) Field of Classification Search
CPC .................. H01L 21/67144; H01L 21/67132; H01L 21/67155; H01L 21/68707; H01L 21/68764; H01L 21/68778; H01L 21/68785; H01L 21/677; H01L 21/67259; H01L 21/67271; H01L 21/67294; H01L 22/10; H01L 22/20; H01L 22/30; Y10T 156/1744; Y10T 156/1746

USPC .................................................. 156/538, 539
See application file for complete search history.

(56) References Cited

U.S. PATENT DOCUMENTS

| | | | |
|---|---|---|---|
| 5,799,858 A * | 9/1998 | Nam ................. | H01L 21/67144 228/44.7 |
| 6,179,938 B1 * | 1/2001 | Mannhart ......... | H01L 21/67144 156/64 |
| 6,774,011 B2 | 8/2004 | Nakazawa et al. | |
| 7,238,258 B2 | 7/2007 | Park et al. | |
| 7,306,695 B2 | 12/2007 | Kasai | |
| 7,759,164 B2 | 7/2010 | Maki et al. | |
| 8,020,287 B2 | 9/2011 | Emoto et al. | |
| 8,211,261 B2 | 7/2012 | Maki et al. | |
| 8,256,103 B2 | 9/2012 | Choy et al. | |
| 8,593,261 B2 | 11/2013 | Takagi et al. | |
| 2005/0274457 A1 | 12/2005 | Cheung et al. | |

(Continued)

FOREIGN PATENT DOCUMENTS

| | | |
|---|---|---|
| KR | 1019960052730 | 11/1996 |
| KR | 1019980034608 | 11/1996 |

(Continued)

*Primary Examiner* — Philip Tucker
*Assistant Examiner* — Jimmy Smith, Jr.
(74) *Attorney, Agent, or Firm* — Myers Bigel & Sibley, PA

(57) ABSTRACT

A die bonding device includes: a wafer holder supporting a wafer where a die is formed; an ejector holder disposed at the wafer holder below the wafer and supporting a die ejector that assists separating the die from the wafer; a support unit supporting a substrate where the die is to be attached; a bonding unit that picks up the die from the wafer and attaches the picked-up die to the substrate; an ejector buffer unit that receives the die ejector; and a replacing unit that transfers the die ejector between the ejector holder and the ejector buffer unit.

20 Claims, 15 Drawing Sheets

(56) References Cited

U.S. PATENT DOCUMENTS

2006/0060146 A1* 3/2006 Cha .................. H01L 21/68714
                                                                                       118/728
2009/0211709 A1* 8/2009 Choy ...................... H01L 21/68
                                                                                       156/350
2012/0075079 A1* 3/2012 Takagi ................... G05B 19/12
                                                                                   340/10.51

FOREIGN PATENT DOCUMENTS

| KR | 1020000084890 | 1/2003 |
| KR | 1020020055689 | 1/2003 |
| KR | 1020010019949 | 4/2007 |
| KR | 1020020079209 | 4/2007 |
| KR | 1020090113510 | 11/2009 |
| KR | 1020120018503 | 3/2012 |

* cited by examiner

DIE BONDING DEVICE

CROSS-REFERENCE TO RELATED APPLICATIONS

This U.S. non-provisional patent application claims priority under 35 U.S.C. §119 to Korean Patent Application No. 10-2014-0045560, filed on Apr. 16, 2014, the content of which is hereby incorporated by reference in its entirety.

BACKGROUND

A semiconductor package process includes a sawing process for cutting a wafer into dies (i.e., a semiconductor chip) individually, a die bonding process for attaching the individual dies to a substrate, a wire bonding process for connecting the individual dies and connection pads electrically, a molding process for molding the individual dies and the peripheral portions thereof, and a process for forming an external connection terminal at a ball pad of the substrate.

The die bonding process for attaching the die to the substrate is performed by a die bonding device. The die bonding device picks up a die provided in a state of being attached to the wafer and attaches the picked-up die to a substrate. The process for picking up a die from a wafer may be assisted by a die ejector.

SUMMARY

The inventive concept disclosed herein relates to a die bonding device.

The inventive concept disclosed herein provides a die bonding device for efficiently attaching a die to a substrate.

The inventive concept disclosed herein also provides a die bonding device for replacing a die ejector.

The inventive concept disclosed herein also provides a die bonding device for replacing a collet.

Some embodiments of the inventive concept provide a die bonding device. The die bonding device includes: a wafer holder supporting a wafer on which a die is formed; an ejector holder disposed at an inner portion of the wafer holder and below the wafer and supporting a die ejector configured to help separate the die from the wafer; a support unit supporting a substrate on which the separated die is to be attached; a bonding unit configured to pick up the separated die from the wafer and attach the picked-up die to the substrate; an ejector buffer unit configured to receive the die ejector; and a replacing unit configured to transfer the die ejector between the ejector holder and the ejector buffer unit.

The ejector buffer unit may include a plate shaped ejector buffer member including at least one fixing member configured to receive the die ejector at the ejector buffer member. The fixing member may protrude from a top of the ejector buffer member and may include an electromagnet. The fixing member may be provided as a recess formed at a top of the ejector buffer member. The fixing member may include a plurality of fixing hooks each including a latch member configured to be received in a recess of the die ejector so as to fix the die ejector at the ejector buffer unit. The ejector buffer unit may include a check member disposed adjacent to the ejector buffer member and configured to check a type of the die ejector disposed at the fixing member or to check whether the fixing member is empty.

The replacing unit may include: a movable replacing body; at least one finger configured to pick up the die ejector; and an arm movably connecting the finger to the replacing body.

The replacing unit may include a movable replacing body. A pickup channel configured to receive the die ejector may be formed in the replacing body. An electromagnet may be in the replacing body adjacent to the pickup channel.

Some other embodiments of the inventive concept are directed to a die bonding device. The die bonding device includes: a wafer holder supporting a wafer on which a die is formed; an ejector holder disposed at the wafer holder below the wafer and supporting a die ejector configured to help separate the die from the wafer; a support unit supporting a substrate on which the separated die is to be attached; a bonding unit configured to pick up the separated die from the wafer and attach the picked-up die to the substrate, with the bonding unit including a bonding member holding a collet at a bottom portion thereof such that the picked-up die contacts the collet; an ejector buffer unit configured to receive the die ejector; and a replacing unit configured to transfer the die ejector between the ejector holder and the ejector buffer unit.

The die bonding device may include a collet buffer member including a collet receiving recess configured to receive the collet from the bonding unit. The receiving recess may include a first receiving portion and a second receiving portion that intersects the first receiving portion, with each sized and configured to receive the collet. A test unit may be disposed on the collet buffer member, with the test unit configured to measure a horizontal degree of the collet that is held by the bonding unit. The collet buffer member may include a plurality of receiving recesses, and a jig having a shape corresponding to the collet and having a hardness greater than the collet may be disposed at one of the receiving recesses. The collet buffer member may include a magnet disposed adjacent to the receiving recess.

The bonding member may be movable and include an electromagnet disposed at a bottom portion thereof that is configured to detach the collet from the bonding member. The bonding member may be movable and include fixing hooks rotatably coupled to the bonding member and configured to apply pressure on an outer surface of the collet to fix the collet to the bonding member.

Some other embodiments of the inventive concept are directed to a die bonding device. The die bonding device includes: a wafer holder supporting a wafer comprising a die; an ejector holder holding a die ejector below the die, with the die ejector configured to separate the die from the wafer; a support unit supporting a substrate; a bonding unit configured to pick up the separated die from the wafer and attach the picked-up die to the substrate; an ejector buffer unit configured to receive the die ejector; and a replacing unit configured to transfer the die ejector between the ejector holder and the ejector buffer unit.

The replacing unit may include a movable replacing body and an attaching feature configured to attach the die ejector to the replacing unit. The attaching feature may include a plurality of fingers movably attached to the replacing body, with each of the fingers sized and configured to be received in a respective recess formed in the die ejector. The attaching feature may include: a channel formed in a bottom portion of the replacing body that is sized and configured to receive a top portion of the die ejector; and an electromagnet in the replacing body and adjacent the channel.

BRIEF DESCRIPTION OF THE DRAWINGS

The accompanying drawings are included to provide a further understanding of the inventive concept, and are incorporated in and constitute a part of this specification.

The drawings illustrate exemplary embodiments of the inventive concept and, together with the description, serve to explain principles of the inventive concept. In the drawings.

DETAILED DESCRIPTION OF THE EMBODIMENTS

Figure 1:
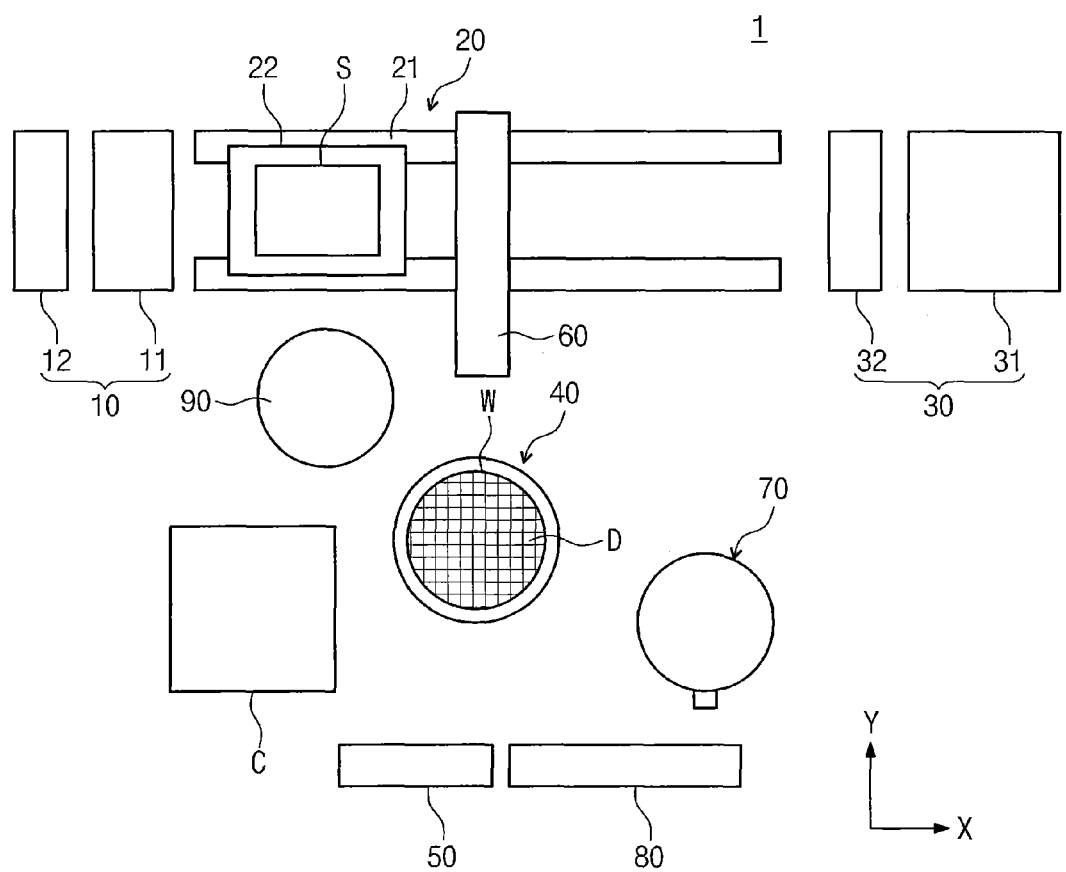
FIG. 1 is a plan view of a die bonding device according to an embodiment of the inventive concept.

Hereinafter, various embodiments of the inventive concept will be described with reference to the accompanying drawings. However, embodiments of the inventive concept may be modified in various forms, and the scope of the inventive concept is not limited to the following embodiments. These embodiments are provided so that the inventive concept will be further completely described to those skilled in the art. Accordingly, the forms of elements in the drawings are exaggerated for clarity of description.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "includes," "comprising," and/or "including," when used in this specification, specify the presence of stated features, integers, steps, operations, elements, and/or components, but do not preclude the presence or addition of one or more other features, integers, steps, operations, elements, components, and/or groups thereof.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present inventive concept are explained in detail in the specification set forth below.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view of a die bonding device according to an embodiment of the inventive concept.

Referring to FIG. 1, the die bonding device 1 includes a loading member 10, a support unit 20, an unloading member 30, a wafer holder 40, a transfer unit 50, a bonding unit 60, an ejector buffer unit 70, a replacing unit 80, and a collet buffer member 90.

Hereinafter, a separation direction between the loading member 10 and the unloading member 30 is a first direction X and a direction perpendicular to the first direction X seen from the top is referred to as a second direction Y.

The loading member 10 loads a substrate S into or onto the support unit 20. The loading member 10 includes a supply container 11 and a loader 12. The supply container 11 receives substrates S where a semiconductor chip (hereinafter referred to as a die) is to be attached. The loader 12 loads the substrates S received in the supply container 11 to the support unit 20 sequentially. The substrate S received in the supply container 11 may be a printed circuit board (PCB) or a lead frame.

The support unit 20 provides a space where the die D is attached to the substrate S after the substrate S is loaded by the loading member 10. The support unit 20 is disposed adjacent to the loading member 10. The support unit 20 includes rails 21 and a carrier or shutter or shuttle 22.

The rails 21 may be disposed between the loading member 10 and the unloading member 30. For example, a length direction of the rails 21 may be in the first direction X. The rails 21 may be spaced apart from each other in the second direction Y.

The shutter 22 may be provided on the rails 21. The shutter 22 provides a space for the substrate S onto which the die D is to be attached. The top of the shutter 22 may be planar. Additionally, the top area of the shutter 22 may be greater than the area of the substrate S. The rails 21 may be movable by power provided from the outside between the loading member 10 and the unloading member 30 such that the shutter 22 is movable along the rails 21.

The unloading member 30 unloads the substrate S including the attached die D from the support unit 20. The unloading member 30 is disposed adjacent to the support unit 20. For example, the unloading member 30 may be disposed opposite to the loading member 10 with respect to the support unit 20. The unloading member 30 includes a receiving container 31 and an unloader 32. The receiving container 31 receives the substrate S including the attached die D. The unloader 32 unloads the substrate S including the attached die D from the shutter 22 and loads it to the receiving container 31.

Figure 2:
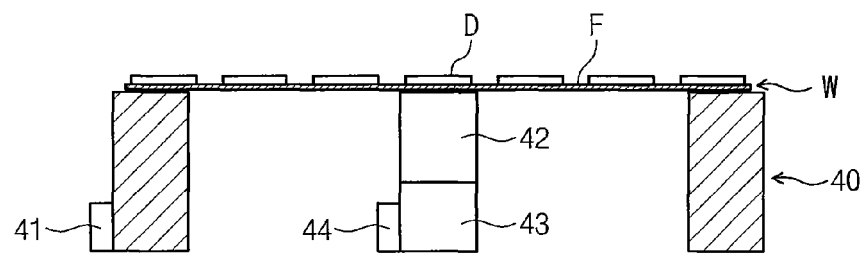
FIG. 2 is a cross-sectional view of a wafer holder.

FIG. 2 is a cross-sectional view of the wafer holder of FIG. 1.

Referring to FIGS. 1 and 2, the wafer holder 40 supports a wafer W while the die D is separated from the wafer W. The wafer holder 40 is disposed adjacent to the support unit 20. For example, the wafer holder 40 may be disposed spaced apart from the rails 21 in the second direction Y.

The wafer W may be transferred to an area adjacent to the wafer holder 40 while being received in a cassette C. The cassette C may be transferred by an operator or a carrier device. For example, the carrier device may be an Overhead Hoist Transport (OHT) or an automatic guided vehicle.

The transfer unit 50 is disposed adjacent to the wafer holder 40 and the cassette C. The transfer unit 50 withdraws the wafer W from the cassette C and places it on the wafer holder 40.

The wafer W may be a wafer where a fabrication process, an electrical die sorting (EDS) process, and a back grinding process are performed. A film F is attached to the wafer W and a sawing process is performed. Thus, the dies D are attached on the film F. A UV treatment may be performed on the top of the film F, so as to help separate the dies D. Additionally, a wafer ring may be provided at the edge of the wafer W. The wafer holder 40 supports the wafer W while pulling the wafer ring outwardly, and thus the film F expands. Thus, the die D is separated from the film F.

A die ejector 42 may be disposed below the wafer W in the wafer holder 40. The die ejector 42 assists the separation of each die D from the film F.

A first transfer member 41 may be provided with the wafer holder 40. The first transfer member 41 may transfer the wafer holder 40 with respect to the die ejector 42 in the first direction X or the second direction Y. Accordingly, when one die D is separated by the die ejector 42 and transferred to the bonding unit 60, the wafer holder 40 moves to allow another die D to be disposed on the top of the die ejector 42.

The die ejector 42 may be replaceable. For example, the die ejector 42 may be detachable from the ejector holder 43. The ejector holder 43 may be disposed below the wafer W. A second transfer member 44 may be provided with the ejector holder 43. The second transfer member 44 may transfer the ejector holder 43 with respect to the wafer holder 40 in the first direction X or the second direction Y. Accordingly, when one die D is separated by the die ejector 42, the die ejector 42 may move to allow another die D to be disposed on the top of the die ejector 42. Additionally, the first transfer member 41 and the second transfer member 44 may be provided so that the wafer holder 40 and the die ejector 42 may move at the same time. Additionally, one of the first transfer member 41 and the second transfer member 44 may be omitted so that only one of the wafer holder 40 and the die ejector 42 may move.

After picking up the die D separated from the film F, the bonding unit 60 attaches the die D to the substrate S disposed at the support unit 20. For example, after picking up the die D through a vacuum method, the bonding unit 60 transfers it to the substrate S on the support unit 20. The die D is attached to the substrate S by an adhesive. The adhesive includes a conductive adhesive and may be or include, for example, Ag-epoxy or Ag-glass.

After an adhesive is coated on the top of the substrate S disposed at the support unit 20, the bonding unit 60 may position the die D on the top of the substrate S. At this point, the bonding unit 60 may apply pressure on the top of the die D with a set pressure so as to improve the adhesion degree of the die D. Additionally, the adhesive may be provided at the bottom of the die D attached to the substrate S. That is, the adhesive may be provided between the bottom of the die D and the top of the film F. The adhesive may be separated from the film F together with the die D.

Figure 3:
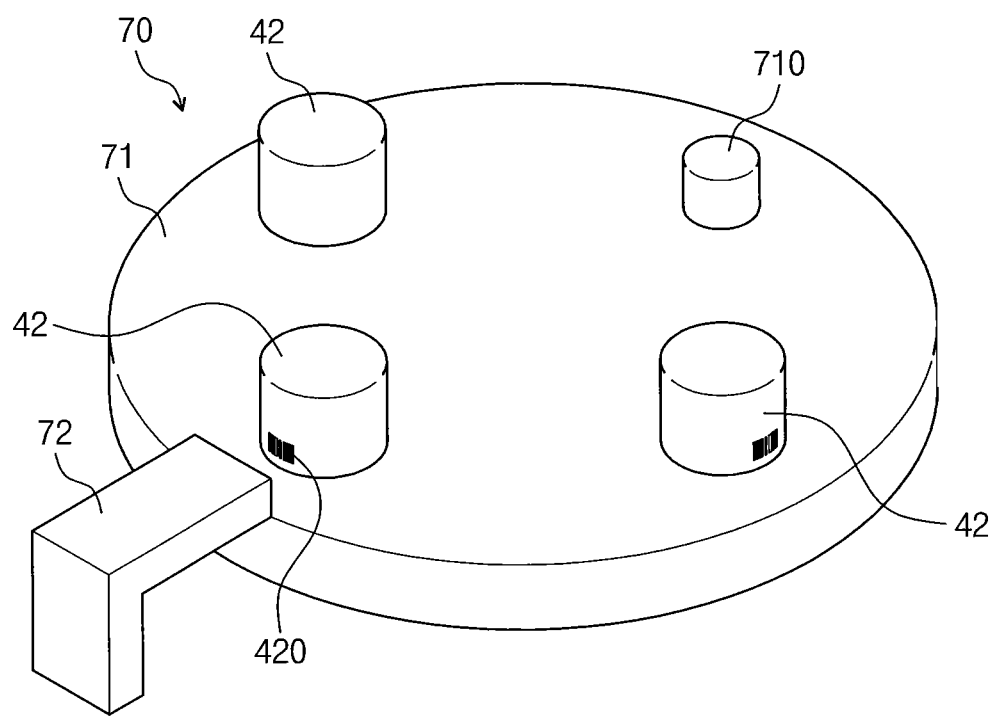
FIG. 3 is a perspective view of an ejector buffer unit.
Figure 4:
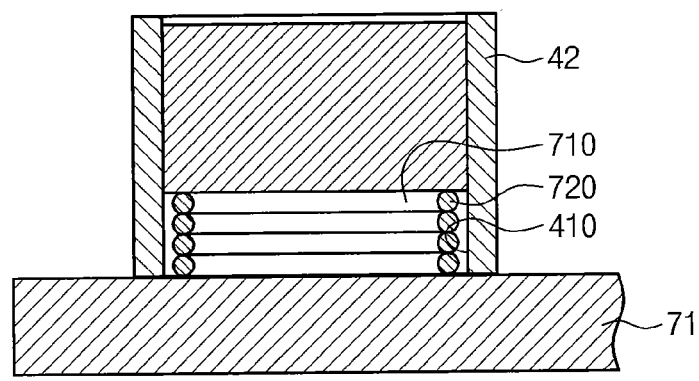
FIG. 4 is a cross-sectional view illustrating a portion of an ejector buffer member where a die ejector is disposed.

FIG. 3 is a perspective view of an ejector buffer unit and FIG. 4 is a cross-sectional view of an ejector buffer member at a portion where a die ejector is disposed.

Referring to FIGS. 1 to 4, the ejector buffer unit 70 includes an ejector buffer member 71 and a check member 72.

The ejector buffer member 71 may store at least one die ejector 42. A plurality of fixing members or parts 710 may be provided with the ejector buffer member 71. The die ejector 42 may be disposed at each of the fixing parts 710. Each of the fixing parts 710 may protrude above a top surface of the ejector buffer member 71. A fixing channel or groove 410 where the fixing part 710 is inserted may be formed at the bottom of the die ejector 42. The form or shape of the fixing groove 410 may be provided in correspondence to the form or shape of the fixing part 710. Accordingly, when the fixing part 710 is received in the fixing groove 410, the die ejector 42 may be disposed at a predetermined position on the ejector buffer member 71.

An electromagnet 720 may be provided with the fixing part 710. A portion of the die ejector 42 (e.g., a portion adjacent to the inner circumference surface of the fixing groove 410) may be provided with a metallic material. Accordingly, when the electromagnet 720 is turned on, the die ejector 42 may be fixed to the ejector buffer member 71.

The ejector buffer member 71 may be provided as a circular or polygonal plate. The ejector buffer member 71 may adjust the position of the die ejector 42. For example, the ejector buffer member 71 may rotate at one point (e.g., rotate about an axis defined by the center of the ejector buffer member 71). Then, the fixing part 710 may be disposed spaced a predetermined distance apart from the center. Each fixing part 710 may be disposed on the circumference portion spaced a predetermined radius apart from the center. Additionally, each fixing part 710 may be spaced a different distance apart from the center.

The check member 72 is disposed adjacent to the ejector buffer member 71 and checks the type of the die ejector 42 disposed at the ejector buffer member 71. Moreover, the check member 72 may check for an empty fixing part 710. An information providing feature or unit 420 for checking the type of the die ejector 42 may be provided on or with the die ejector 42. As one example, the check member 72 may be provided as a barcode reader. Then, the information providing unit 420 may be a barcode provided on the outer circumference surface of the die ejector 42. The check member 72 may obtain information for checking the type of the die ejector 42 through a barcode. As another example, the information providing feature or unit 420 may be or include an appearance, shape, or color of the outer surface of the die ejector 42. The appearance, shape, or color may be different according to the type of the die ejector 42. Also, the check member 72 may be provided as a camera for obtaining the above information. The check member 72 may move to allow the position on a plane to be adjustable (e.g., the check member 72 may rotate relative to the ejector buffer member 71). Additionally, the check member 72 may move to allow the height to be adjustable. Furthermore, the check member 72 may move to allow the height and position on a plane to be adjustable.

The replacing unit 80 picks up the die ejector 42 from the ejector holder 43 and places it at the ejector buffer member 71 or picks up the die ejector 42 from the ejector buffer member 71 and places it at the ejector holder 43.

Figure 5:
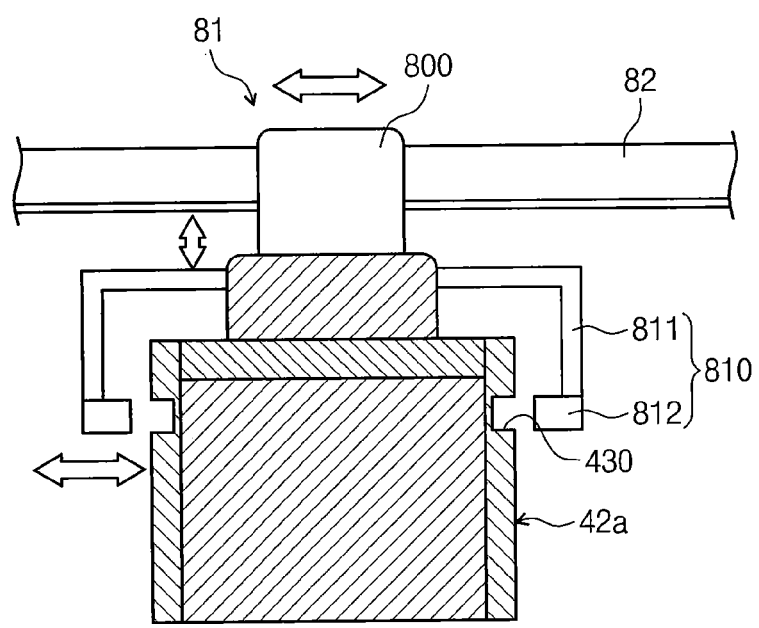
FIG. 5 is a schematic view illustrating a replacing member according to an embodiment of the inventive concept.

FIG. 5 illustrates a replacing member according to an embodiment of the inventive concept.

Referring to FIG. 5, the replacing unit 80 includes the replacing member 81. The replacing member 81 picks up a die ejector 42a. The replacing member 81 is movable between the ejector holder 43 and the ejector buffer unit 70.

The replacing member 81 includes a replacing body 800 and a pickup member 810.

The replacing body 800 may move to allow the position on a plane (e.g., a horizontal plane) to be variable. Additionally, the replacing body 800 may move to allow the height or its vertical position to be adjustable. As one example, the replacing body 800 is movably coupled to a guide member 82 provided with the replacing unit 80. The guide member 82 is configured to guide the movement of the replacing body 800 and may be or include, for example, a rail, a belt, or a chain.

The pickup member 810 fixes the die ejector 42a at the replacing body 800. The pickup member 810 includes an arm 811 and a finger 812. The arm 811 extends outwardly from the outer circumference surface of the replacing body 800. An end part of the arm 811 is bent downwardly. The finger 812 extends inwardly from the end part of the arm 811 in the direction of the replacing body 800. The arm 811 moves the finger 812. The finger 812 may apply pressure on the outer circumference surface of the die ejector 42a to fix the die ejector 42a at the replacing body 800.

A finger insertion area or part 430 may be formed at the outer circumference surface of the die ejector 42a. The finger insertion part 430 may be provided as a groove or recess having a form or shape corresponding to the finger 812. Accordingly, the replacing member 81 may fix the die ejector 42a by inserting the finger 812 into the finger insertion part 430.

Additionally, the transfer unit 50 and the replacing unit 80 may be provided integrally.

Figure 6:
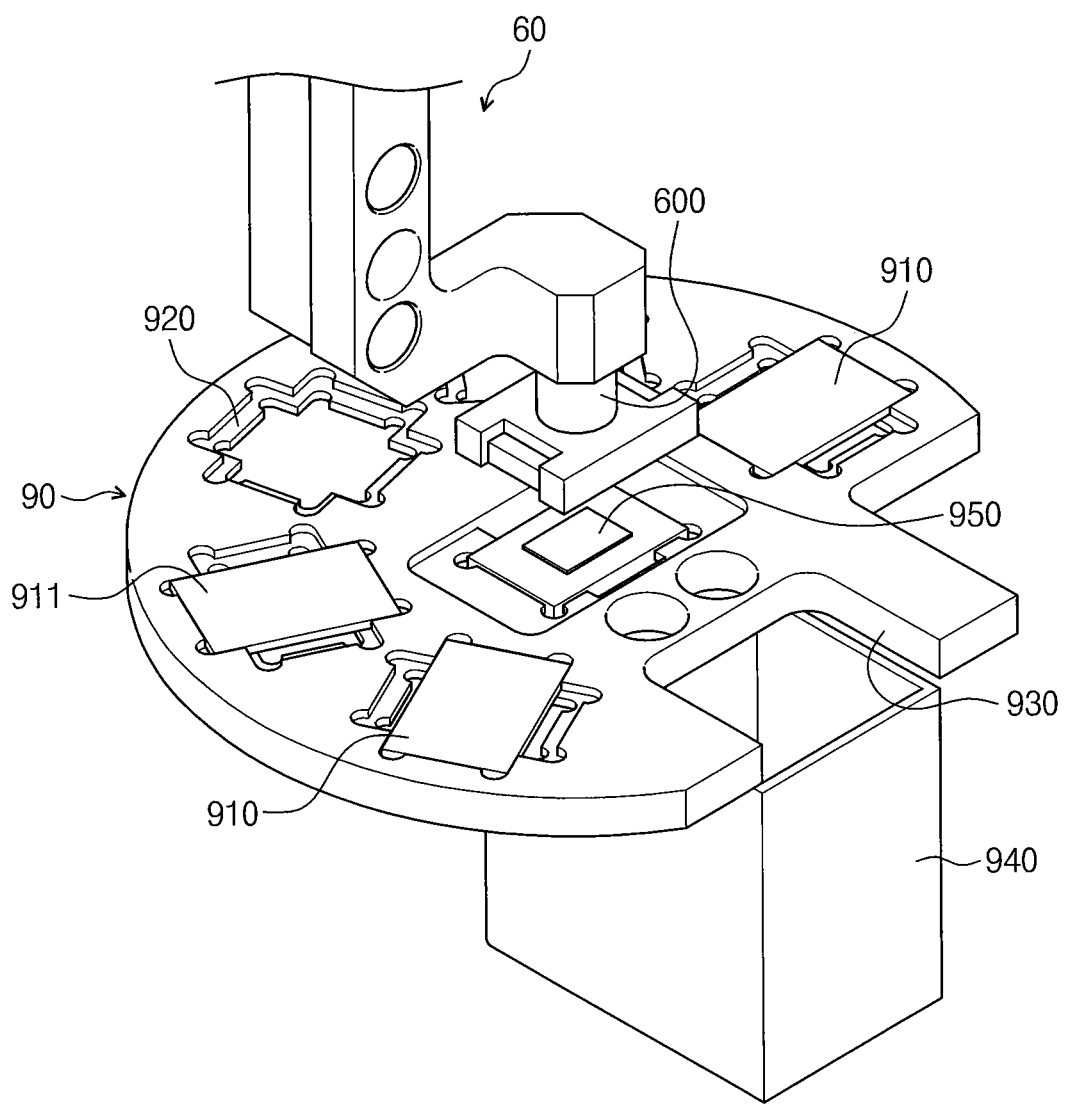
FIG. 6 is a perspective view illustrating a collet buffer member and a portion of a bonding member.
Figure 7:
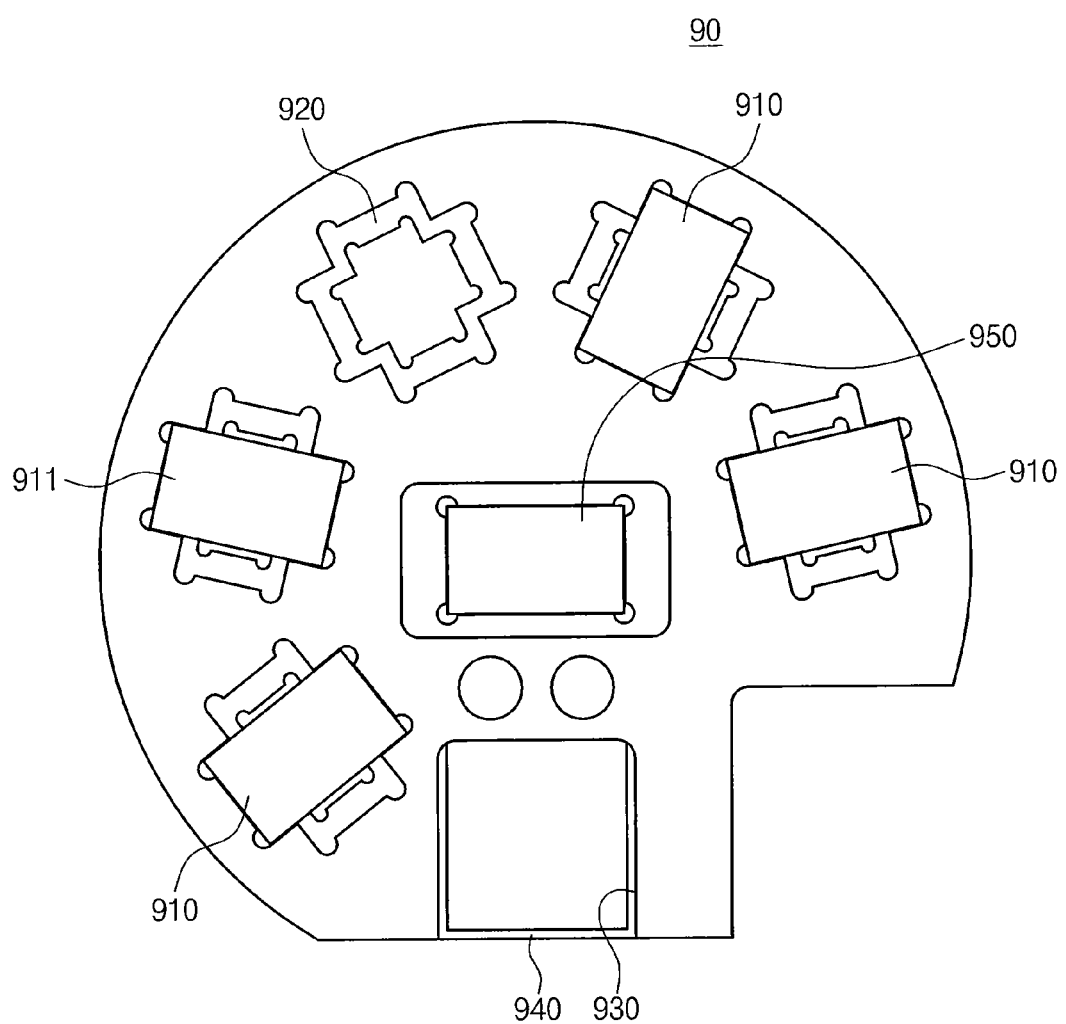
FIG. 7 is a plan view of a collet buffer member.

FIG. 6 is a perspective view illustrating a collet buffer member and a portion of a bonding unit and FIG. 7 is a plan view of the collet buffer member.

Referring to FIGS. 1, 6, and 7, the collet buffer member 90 may receive at least one collet 910.

The collet buffer member 90 may be provided in a plate shape or as a plate member. The top of the collet buffer member 90 may be provided in a circular or polygonal shape.

A plurality of receiving grooves or recesses 920 are formed on the top of the collet buffer member 90. The collet buffer member 90 may move to allow the positions of the receiving grooves 920 to be changed. As one example, the receiving grooves 920 may be arranged on the circumference portion spaced a set distance apart from the center of the collet buffer member 90. Then, the collet buffer member 90 rotates about the center so that the positions of the receiving grooves 920 may move along the circumference portion. Each receiving groove 920 may receive a collet 910.

The collet 910 is attached to the bonding unit 60. In more detail, the bonding member 600 is provided with the bonding unit 60. The collet 910 is attached to the bottom of the bonding unit 600. When the bonding member 600 picks up the die D, the collet 910 contacts the die D. The bonding member 600 picks up the die D and attaches it to the substrate S as the bonding member 600 moves between the wafer holder 40 and the support unit 20. Additionally, the bonding member 600 may move to the collet buffer member 90 and may then replace the collet 910.

A retrieving part or area 930 may be formed at the collet buffer member 90. The retrieving unit 930 may be provided as an opening that extends inwardly from the side of the collet buffer member 90. Additionally, the retrieving part 930 may be provided as a hole or opening. That is, the receiving part or area 930 may be an opening that may be defined in an outer portion of the collet buffer member 90. The retrieving part 930 may be disposed on the circumference portion of the collet buffer member 90 where the receiving grooves 920 are formed. A collection box 940 may be provided below the retrieving part 930. The collection box 940 and the collet buffer member 90 may be provided integrally. Additionally, the collection box 940 may be provided separate from the collet buffer member 90 and may be disposed below the collet buffer member 90. The bonding member 600 may separate the collet 910 above the retrieving part 930 and then the collet 910 may be received in the collection box 940 and discarded.

A test unit 950 may be provided at the top of the collet buffer member 90. As one example, the test unit 950 may be disposed at the center of the collet buffer member 90. Additionally, the test unit 950 may be disposed at the same circumference portion as the receiving groove(s) 920 or at some other area away from the center of the collet buffer member 90. Instead of the collet 910, a jig 911 may be disposed at a middle portion of the receiving groove 920. The jig 911 is provided in a shape corresponding to the collet 910. The test unit 950 and the jig 911 will be described in more detail below.

Figure 8:
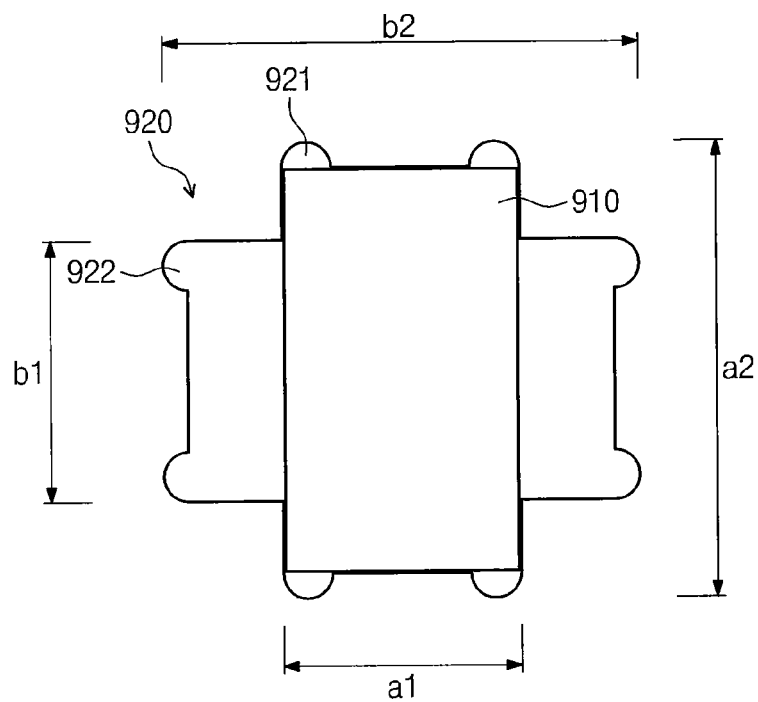
FIGS. 8 and 9 are plan views illustrating when a collet is received in a receiving groove.
Figure 9:
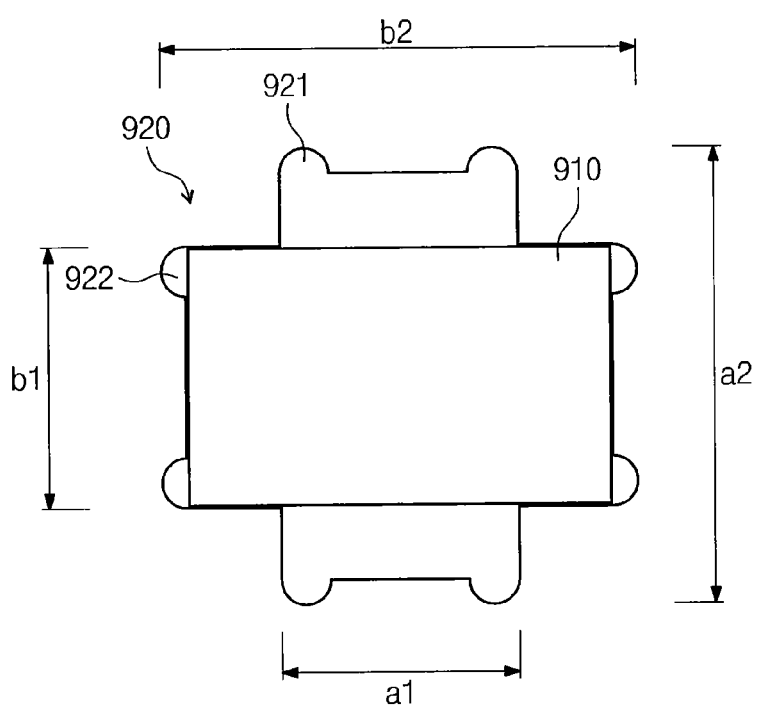

FIGS. 8 and 9 are views illustrating when a collet is received in a receiving groove.

Referring to FIGS. 8 and 9, the receiving groove 920 may receive the collet 910 through different methods. In more detail, the receiving groove 920 may be provided in a cross shape where a first receiving unit 921 and a second receiving unit 922 intersect each other. The collet 910 may be selectively disposed at the first receiving unit 921 or the second receiving unit 922. The first receiving unit 921 and the second receiving unit 922 may receive different sizes of the collets 910. For example, the width a1 of the first receiving unit 921 and the width b1 of the second receiving unit 922 may be different. Alternatively, the length a2 of the first receiving unit 921 and the length b2 of the second receiving unit 922 may be different. Alternatively, the width a1 and the length a2 of the first receiving unit 921 and the width b1 and the length b2 of the second receiving unit 922 may be different. Alternatively, the first receiving unit 921 and the second receiving unit 922 may be sized to receive the same size of the collet 91Q.

Figure 10:
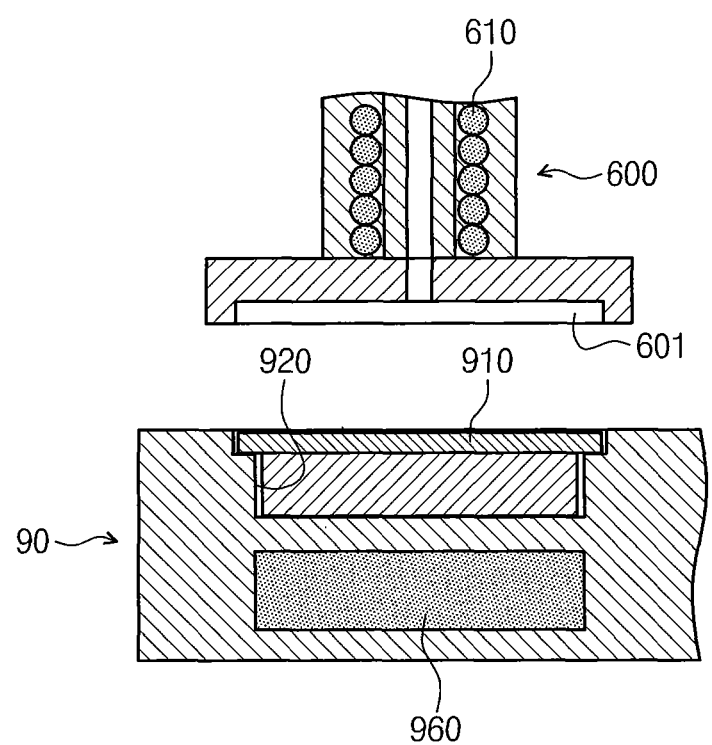
FIG. 10 is a cross-sectional view illustrating a bonding member and a portion of a collet buffer member.

FIG. 10 is a cross-sectional view illustrating a bonding member and a portion of a collet buffer member.

Referring to FIG. 10, a fixing member 610 is provided with a bonding member 600. A collet 910 may be detachable from the bottom of the bonding member 600 by the fixing member 610.

The fixing member 610 may be or include an electromagnet. The fixing member 610 may be provided at the top or at a top portion of the bonding member 600. The fixing member 610 may be inside the bonding member 600 or may be disposed at the outer surface of the bonding member 600. The collet 910 may include a metallic portion. For example, the top of the collet 910 may be provided with metal and the bottom of the collet 910 contacting the die D may be provided with elastic rubber, synthetic resin, or a mixture of rubber and synthetic resin. Accordingly, as the electromagnet is turned on or off, the collet 910 may be attached to or separated from the bonding member 600.

The fixing recess or groove 601 may be formed at the bottom or a bottom portion of the bonding member 600. The fixing groove 601 has a shape corresponding to that of the top of the collet 910. When the collet 910 is attached to the fixing member 610, the top of the collet 910 may be inserted into the fixing groove 601.

A magnet 960 may be provided with the collet buffer member 90. The magnet 960 may be disposed inside the collet buffer member 90 below the receiving groove 920. The magnet 960 may fix the collet 910 at the receiving groove 920 by applying magnetic attraction on the collet 910. Then, the fixing member 610 attaches the collet 910 to the bonding member 600 by applying magnetic attraction to the collet 910, which is greater than that between the magnet 960 and the collet 910.

Additionally, the magnet 960 may be disposed inside the collet buffer member 90 or at the top of the collet buffer member 90 and disposed at the side of the receiving groove 920.

Figure 11:
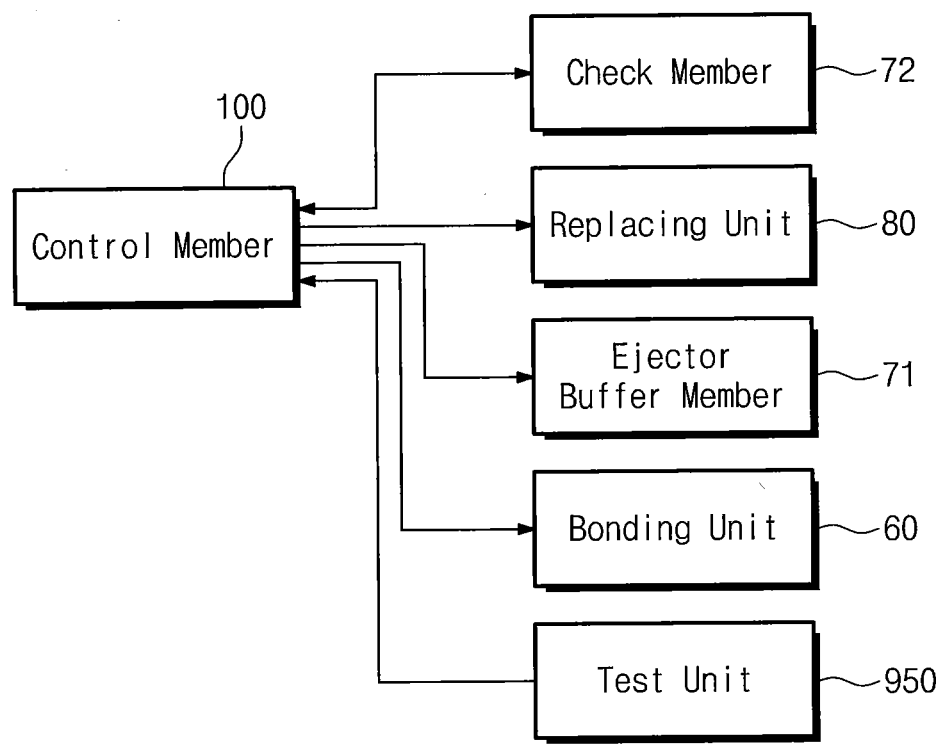
FIG. 11 is a block diagram illustrating the control relationship of a die bonding device.

FIG. 11 is a block diagram illustrating the control relationship of a die bonding device.

Referring to FIG. 11, the control member or controller 100 may control components of the die bonding device 1. The control member 100 may transmit electrical signals to the components of the die bonding device 1 or may receive signals transmitted from the components of the die bonding device 1. For example, the control member 100 may be directly connected to the components of the die bonding device 1 through wires. Additionally, the control member 100 may be connected or communicate to the components of the die bonding device 1 through wireless signals.

In more detail, the control member 100 may receive signals detected by the check member 72 through wired or wireless methods. Additionally, when the check member 72 is movable, the control member 100 may adjust the position of the check member 72. Additionally, when the ejector buffer member 71 is movable, the control member 100 may adjust the movement of the ejector buffer member 71.

Also, the control member 100 may control an operation of the replacing unit 80. According to a control of the control member 100, the replacing unit 80 may move the die ejector 42 disposed at the ejector holder 43 to the ejector buffer member 71 or may move the die ejector 42 disposed at the ejector buffer member 71 to the ejector holder 43.

Also, the control member 100 may control an operation of the bonding unit 60. In more detail, the control member 100 may adjust the position of the bonding member 600.

Also, the control member 100 may receive data transmitted from the test unit 950.

Figure 12:
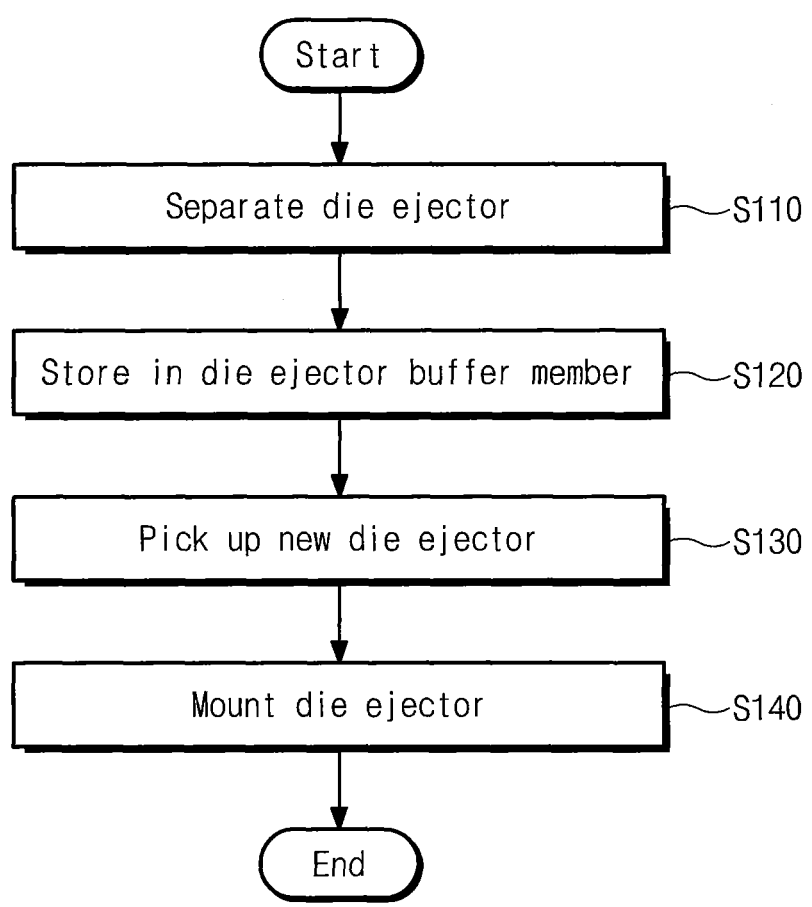
FIG. 12 is a flowchart illustrating an operation in which a die ejector is replaced.

FIG. 12 is a flowchart illustrating the order in which a die ejector is replaced.

Referring to FIG. 12, a process for replacing the die ejector 42 is described.

First, the replacing member 81 separates the die ejector 42 from the ejector holder 43 in operation S110. The die bonding device 1 may need to replace the die ejector 42 during a process. For example, the die ejector 42 corresponding to the size of the die D formed on the wafer W at the wafer holder 40 may be selected.

The replacing member 81 moves the die ejector 42 separated from the ejector holder 43 to the ejector buffer member 71 in operation S120. One of the fixing parts 710 may be empty. The control member 100 controls the replacing unit 80 so that the die ejector 42 separated from the ejector holder 43 is disposed at the empty fixing part 710. The ejector buffer member 71 may move to adjust the position of the empty fixing part 710, so that the efficiency of an operation for positioning the die ejector 42 at the empty fixing part 710 may be improved. The control member 100 may detect the empty fixing part 710 among the empty fixing parts 710 by using the check member 72. Additionally, the control member 100 may store information on the fixing part 710 where the die ejector 42 is disposed and the empty fixing part(s) 710 among the fixing parts 710.

The control member 100 controls the replacing member 81 so as to pick up another die ejector 42 used for separating the die D from the wafer W from the ejector buffer member 71 in operation S130. If there are a plurality of die ejectors 42 in the ejector buffer member 71, the control member 100 may control the replacing member 81 so as to selectively pick up the desired die ejector 42 used for separating the die D from the wafer W.

As one example, the control member 100 may select the die ejector 42 to be picked up by using information on the type of the die ejector 42, which is detected by and transmitted from the check member 72. At this point, while moving the check member 72 with respect to the ejector buffer member 71, the control member 100 may read information on the die ejectors 42 by using the check member 72. Additionally, while moving the ejector buffer member 71 with respect to the check member 72, the control member 100 may read information on the die ejectors 42 by using the check member 72. Additionally, while moving the ejector buffer member 71 and the check member 72 together, the control member 100 may read information on the die ejectors 42 by using the check member 72.

As another example, the control member 100 may store information on the types of die ejectors 42 disposed at the respective fixing parts 710. Then, the control member 100 may allow the die ejector 42 used for separating the die D to be picked up on the basis of stored information on the die ejectors 42.

Then, the control member 100 controls the replacing member 81, so that the picked-up die ejector 42 is mounted at the ejector holder 43 in operation S140.

Figure 13:
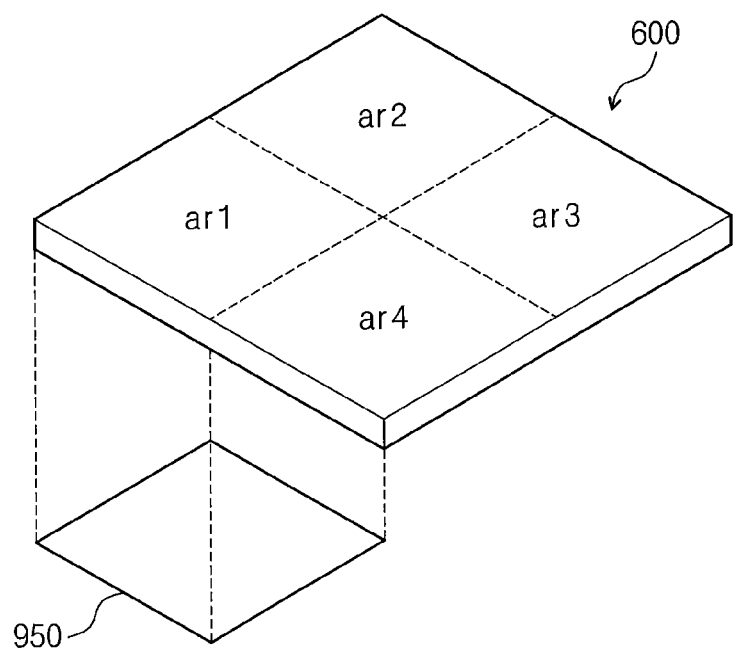
FIGS. 13 and 14 are schematic views illustrating the use of a test unit.
Figure 14:
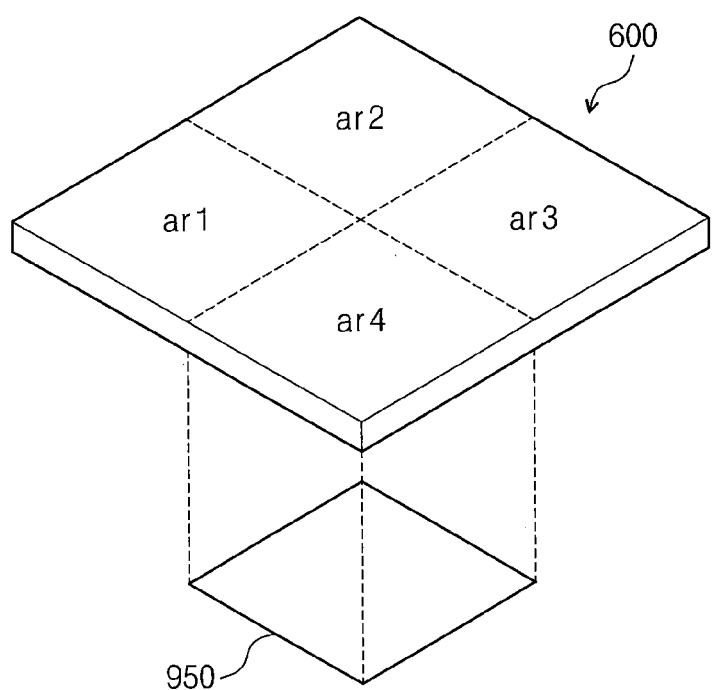

FIGS. 13 and 14 are schematic views illustrating when a test unit is used.

The control member 100 may test a horizontal degree or nature of the bonding member 600 by using data transmitted from the test unit 950.

The horizontal degree of the bottom of the bonding member 600 may vary. That is, the bottom of the bonding member 600 may not be completely horizontal. For example, while the bonding unit 600 is used, the horizontal degree may change by a pressure applied to the bonding member 600. Or, while the collet 910 is attached to the bonding member 600, the horizontal degree may change.

The test unit 950 measures the horizontal degree of the bonding member 600 including the attached collet 910. The bottom of the bonding member 600 may be divided into multiple areas such as more than two areas. For example, the bottom of the bonding member 600 may be divided into four areas ar1, ar2, ar3, and ar4 by the lines crossing the center and intersecting each other. The control member 100 arranges one of the divided areas ar1, ar2, ar3, and ar4 of the bonding member 600 to be above the test unit 950 and then moves the bonding member 600 downward to apply pressure on the test unit 950. The test unit 950 detects the pressure applied by the bonding member 600 and transmits it to the control member 100. The control member 100 may perform such a method on other areas repeatedly. At this point, the control member 100 may control a movement of the bonding member 600 such that the height and force at which the bonding member 600 applies pressure on the test unit 950 is identical.

A pressure detected by the test unit 950 may change according to the horizontal degree of the bottom of the bonding member 600. The control member 100 tests the horizontal degree of the bottom of the bonding member 600 by using such a pressure and determines whether the horizontal degree needs to be adjusted based on predetermined conditions. As one example, when a difference between the maximum value and the minimum value of a pressure is greater than a set value, the control member 100 determines that the horizontal degree needs to be adjusted. Alternatively, when a dispersion value of pressures for an average value of measured pressures is greater than a set value, the control member 100 determines that the horizontal degree needs to be adjusted. Alternatively, when a standard deviation value of pressures for an average value of measured pressures is greater than a set value, the control member 100 determines that the horizontal degree needs to be adjusted. Alternatively, when at least one of measured pressure values is greater than a set value, the control member 100 determines that the horizontal degree needs to be adjusted. Alternatively, when at least one of measured pressure values is less than a set value, the control member 100 determines that the horizontal degree needs to be adjusted.

The jig 911 may be used for measuring the horizontal degree of the bonding member 600. While picking up the jig 911, the bonding member 600 may measure the horizontal degree by using the test unit 950. The bottom of the jig 911 may be harder than the bottom of the collet 910. Accordingly, a height difference according to the bottom area of the bonding member 600 may be more sensitively reflected based on data measured by the test unit 950.

Figure 15:
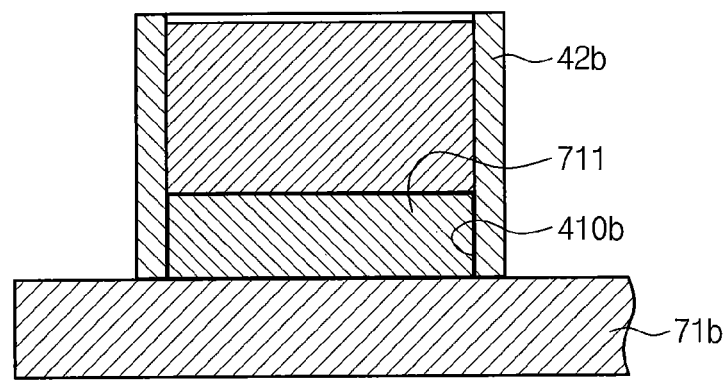
FIG. 15 is a cross-sectional view of an ejector buffer member with a fixing part according to another embodiment of the inventive concept.

FIG. 15 is a cross-sectional view of an ejector buffer member with a fixing part according to another embodiment of the inventive concept.

Referring to FIG. 15, a fixing part or member 711 may protrude above the top surface of an ejector buffer member 71*b*. The form of the fixing part 711 may be provided in correspondence to the form of a fixing channel or groove 410*b* formed at the bottom of a die ejector 42*b*.

The fixing part 711 may be provided as a magnet or may include a magnet. Then, a portion the die ejector 42*b* adjacent to the inner circumference surface of the fixing groove 410*b* or the fixing groove 410*b* may be provided with a metallic material.

The configuration of the ejector buffer member 71*b* and the positions and number of the fixing parts 711 are identical to those of the ejector buffer member 71 and the fixing parts 710 shown in FIG. 3 and thus overlapping descriptions are omitted in the interest of brevity.

Figure 16:
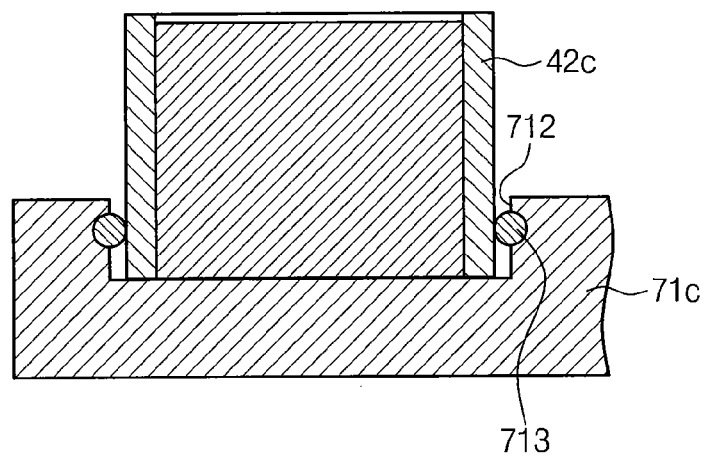
FIG. 16 is a cross-sectional view of an ejector buffer member with a fixing part according to another embodiment of the inventive concept.

FIG. 16 is a cross-sectional view of an ejector buffer member with a fixing part according to another embodiment of the inventive concept.

Referring to FIG. 16, a fixing part 712 may be provided in a groove, channel or recess formed at the top of an ejector buffer member 71*c*. The side shape of the fixing part 712 may generally correspond to the bottom side shape of the die ejector 42*c*. Additionally, a ring 713 may be provided at the side of the fixing part 712 (e.g., at an inner surface of the groove or recess). The ring 713 may apply pressure on the side of the die ejector 42*c*.

The configuration of the ejector buffer member 71*c* and the positions and number of the fixing parts 712 are identical to those of the ejector buffer member 71 and the fixing parts 710 shown in FIG. 3 and thus overlapping descriptions are omitted in the interest of brevity.

Figure 17:
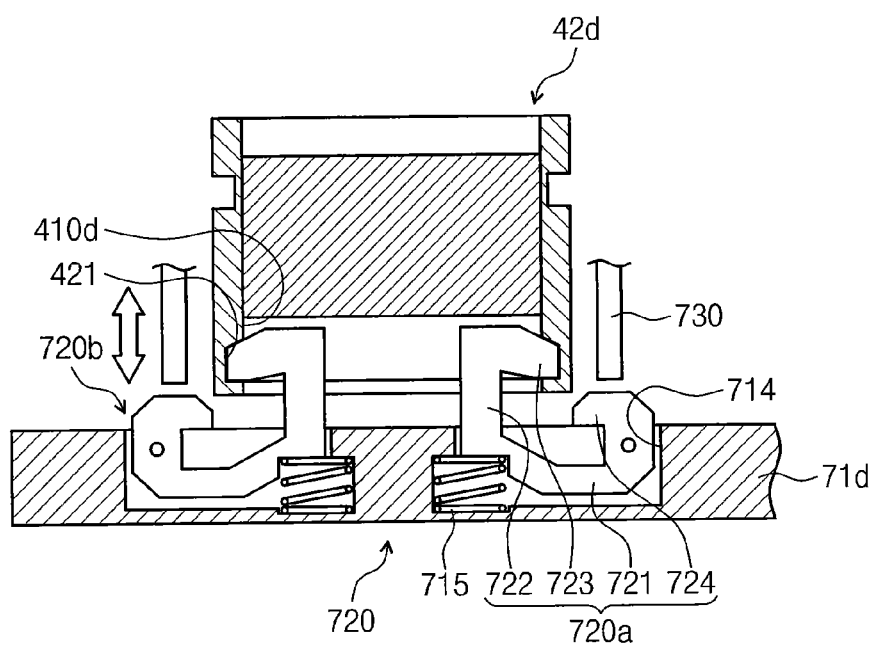
FIG. 17 is a cross-sectional view of an ejector buffer member with a fixing part according to another embodiment of the inventive concept.

FIG. 17 is a cross-sectional view of an ejector buffer member with a fixing part according to another embodiment of the inventive concept.

Referring to FIG. 17, a fixing part 720 may be provided as a plurality of fixing hooks 720*a* and 720*b*. The fixing hooks 720*a* and 720*b* may be inserted into a groove or recesses formed in the die ejector 42*d* to fix the die ejector 42*d*.

As one example, a receiving groove, channel or recess 714 where a portion of the fixing hooks 720*a* and 720*b* are disposed is formed in the ejector buffer member 71*d*. The fixing hooks 720*a* and 720*b* may be axially coupled to the ejector buffer member 71*d* when disposed at the receiving groove 714. Each of the fixing hooks 720*a* and 720*b* includes a rotating part 721, an extension part 722, a latching part 723, and a pressing part 724.

The rotating part 721 has one end extending upwardly and the other end extending and bending toward the center of the fixing part 720. The rotating part 721 allows the fixing hooks 720*a* and 720*b* to be rotatably and axially coupled to the ejector buffer member 71*d*.

The extension part 722 extends from the other end of the rotating part 721 upwardly and protrudes from the top of the ejector buffer member 71*d*. The latching part 723 protrudes from the top of the extension part 722 toward the outer portion of the fixing part 720. An elastic member 715 (e.g., a spring) is disposed below the extension part 722 in the receiving groove 714. The pressing part 724 protruding toward the center of the fixing part 720 is formed at one end of the rotating part 721.

A fixing groove or channel 410d where the fixing hooks 720a and 720b are received is formed at the bottom of the die ejector 42d. The fixing groove 410d may have a depth corresponding to the length of the extension part 722 protruding away from the top of the ejector buffer member 71d. Then, a latching groove or recess 421 corresponding to the latching part 723 is formed at the side of the fixing groove 410d. Accordingly, when the elastic member 714 pushes the extension part 722 upwardly, the latching part 723 is inserted to the latching groove 421, so that the die ejector 42d is fixed at the fixing hooks 720a and 720b. Then, when the vertically movable pressing member 730 presses the pressing part 724, the fixing hooks 720a and 720b are separated from the die ejector 42d. The pressing member 730 may be provided with the replacing unit 80. Additionally, the pressing member 730 may be provided with the ejector buffer member 71d.

The configuration of the ejector buffer member 71d and the positions and number of the fixing parts 720 are identical to those of the ejector buffer member 71 and the fixing parts 710 shown in FIG. 3 and thus overlapping descriptions are omitted in the interest of brevity.

Figure 18:
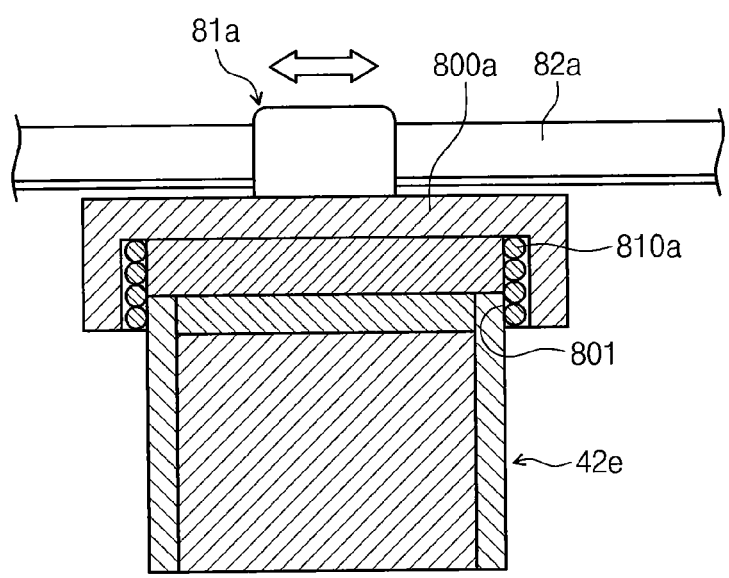
FIG. 18 is a schematic view illustrating a replacing member according to another embodiment of the inventive concept.

FIG. 18 is a schematic view illustrating a replacing member according to another embodiment of the inventive concept.

Referring to FIG. 18, the replacing member 81a includes a replacing body 800a and a pickup member 810a.

A guide member 82a to which the replacing body 800a is coupled is identical to the guide member 82 of FIG. 5 and thus overlapping descriptions are omitted in the interest of brevity.

A pickup groove or channel 801 may be formed at the outer surface of the replacing body 800a. As one example, the pickup groove 801 may be formed at the bottom of the replacing body 800a. The pickup groove 801 may be provided in correspondence to the shape of the top of the die ejector 42e. As the position of the replacing body 800a is adjusted, the top of the die ejector 42e may be inserted into the pickup groove 801.

The pickup member 810a is provided as an electromagnet. The top of the die ejector 42e may be provided with metal or may include metal. Accordingly, the die ejector 42e may be detachable from the replacing member 81a as the pickup member 810a is turned on/off. The pickup member 810a may be disposed adjacent to the pickup groove 801. As one example, the pickup member 810a may be disposed at the inner surface of the pickup groove 801. Additionally, the pickup member 810a may be disposed inside the replacing body 800a and adjacent to the pickup groove 801.

Figure 19:
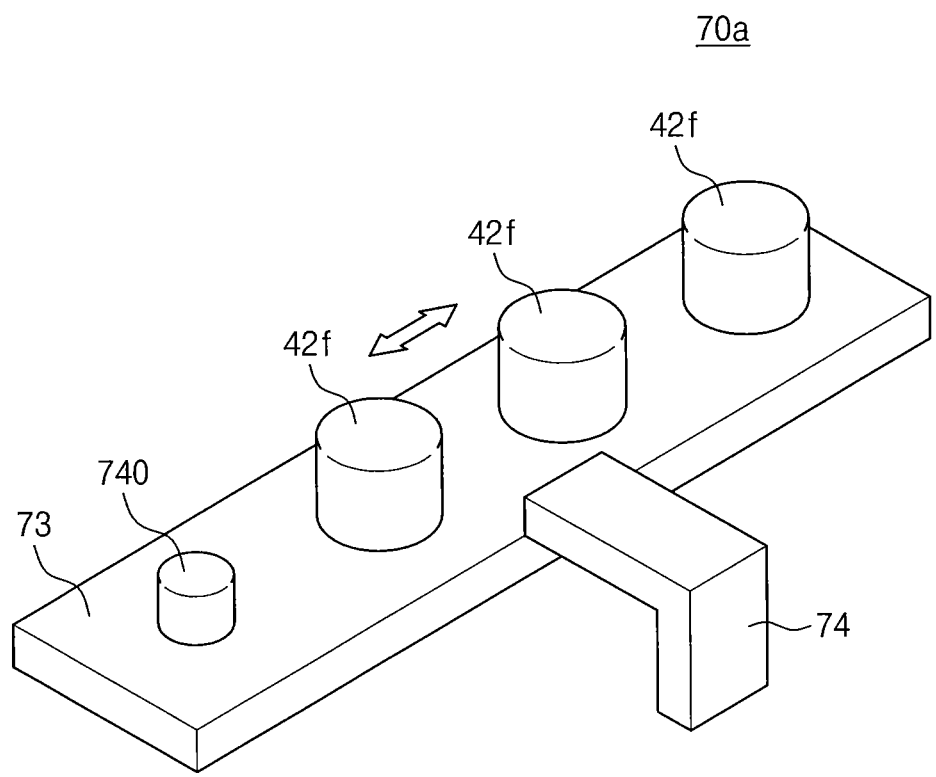
FIG. 19 is a perspective view of an ejector buffer unit according to another embodiment of the inventive concept.

FIG. 19 is a perspective view of an ejector buffer unit according to another embodiment of the inventive concept.

Referring to FIG. 19, the ejector buffer unit 70a includes an ejector buffer member 73 and a check member 74.

The ejector buffer member 73 may store at least one die ejector 42f. A plurality of fixing parts 740 may be provided at or on the ejector buffer member 73. The fixing parts 740 may be aligned and may be arranged parallel to each other. Then, the ejector buffer member 73 may stop to adjust the position along an arrangement direction (e.g., shown by the arrow in FIG. 19) of the fixing part 740. Additionally, the check member 74 may be movable with respect to the ejector buffer member 73 along an arrangement direction (e.g., shown by the arrow in FIG. 19) of the fixing part 740.

The function of the check member 74 is identical to that of the check member 72 of the ejector buffer unit 70 shown in FIG. 3. The configuration of the fixing part 740 is identical to that of the fixing part 710, 711, 712, or 720 shown in FIGS. 4 and 15 to 17. Therefore, overlapping descriptions are omitted in the interest of brevity.

Figure 20:
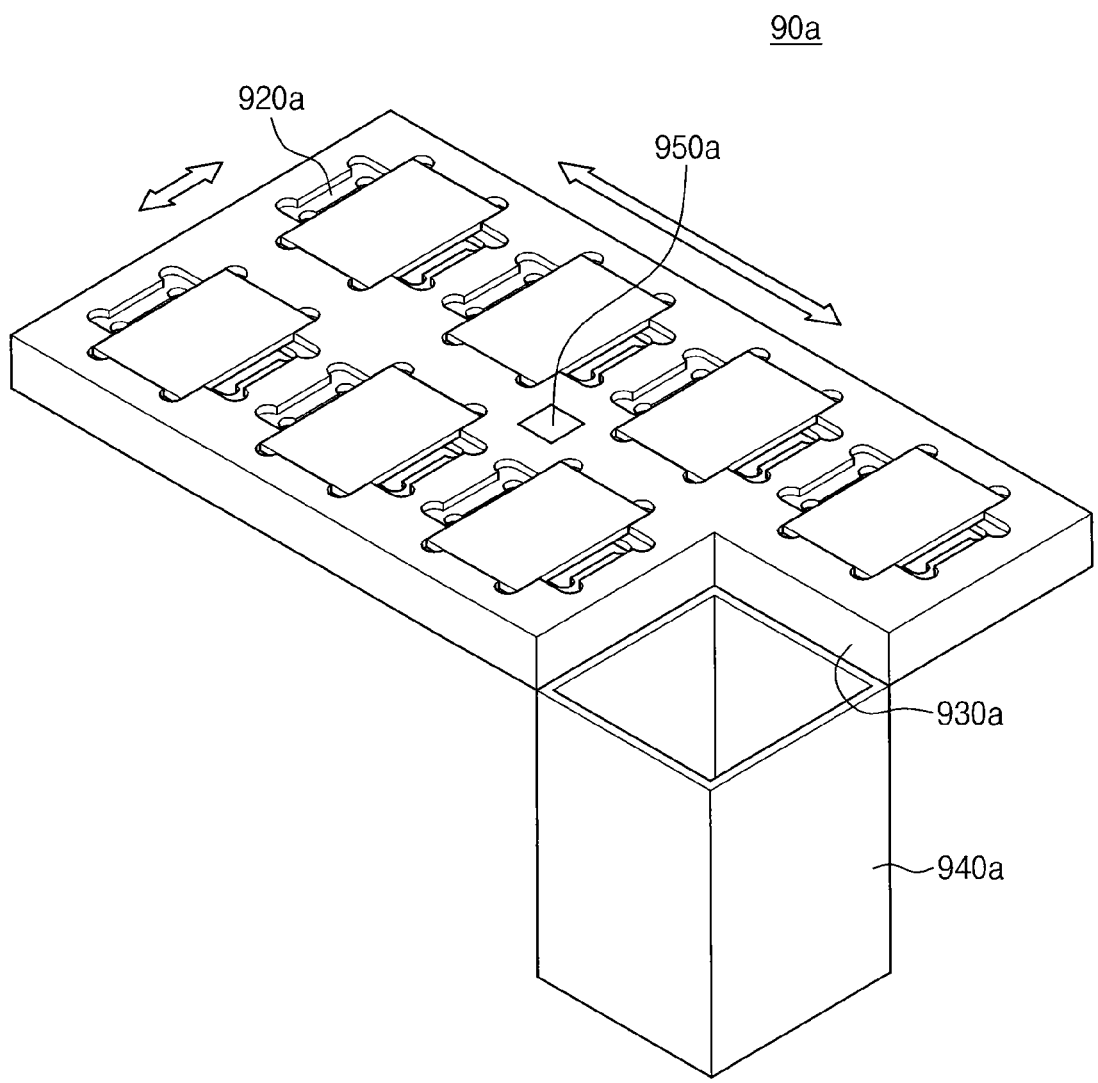
FIG. 20 is a perspective view illustrating a collet buffer member according to another embodiment of the inventive concept.

FIG. 20 is a perspective view illustrating a collet buffer member according to another embodiment of the inventive concept.

Referring to FIG. 20, receiving grooves or recesses 920a may be arranged parallel to adjacent receiving grooves or recesses 920a. For example, the receiving grooves 920a may be arranged in one line. Moreover, the receiving grooves 920a may be arranged in rows and columns. The collet buffer member 90a may be movable along an arrangement direction of the receiving grooves 920 (e.g., shown by the arrow in FIG. 20).

A test unit 950a may be disposed in a space formed between the receiving grooves 920a. Additionally, the test unit 950a may be disposed parallel to the receiving grooves 920a.

A retrieving area or part 930a, a collection box arranged relative to the retrieving part 930a, the forms of the receiving grooves 920a, and the function of the test unit 950a are identical to those of FIG. 6 and thus overlapping descriptions are omitted in the interest of brevity.

Figure 21:
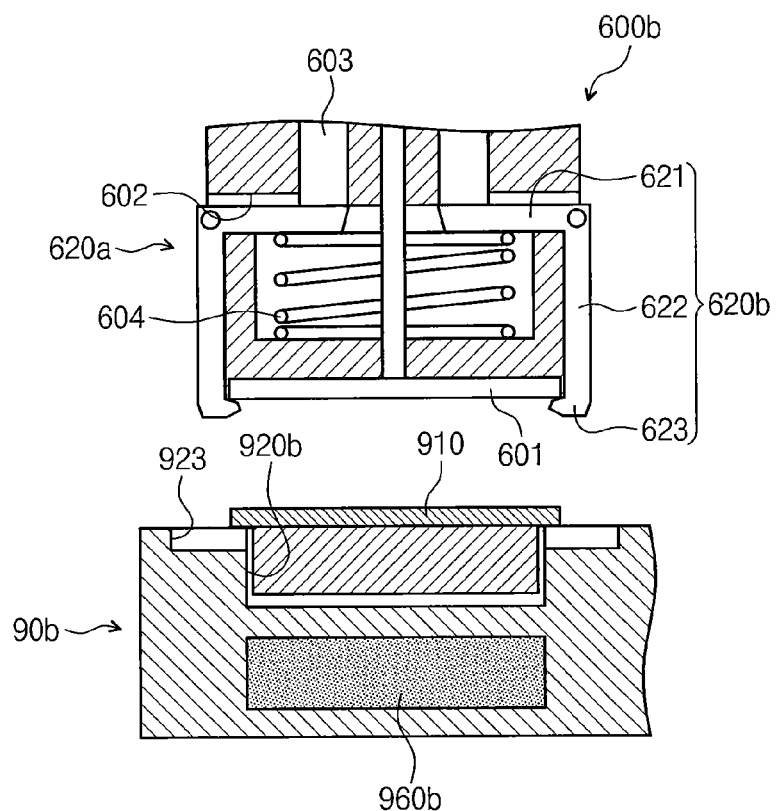
FIG. 21 is a cross-sectional view illustrating a bonding member and a collet buffer member according to another embodiment of the inventive concept.
Figure 22:
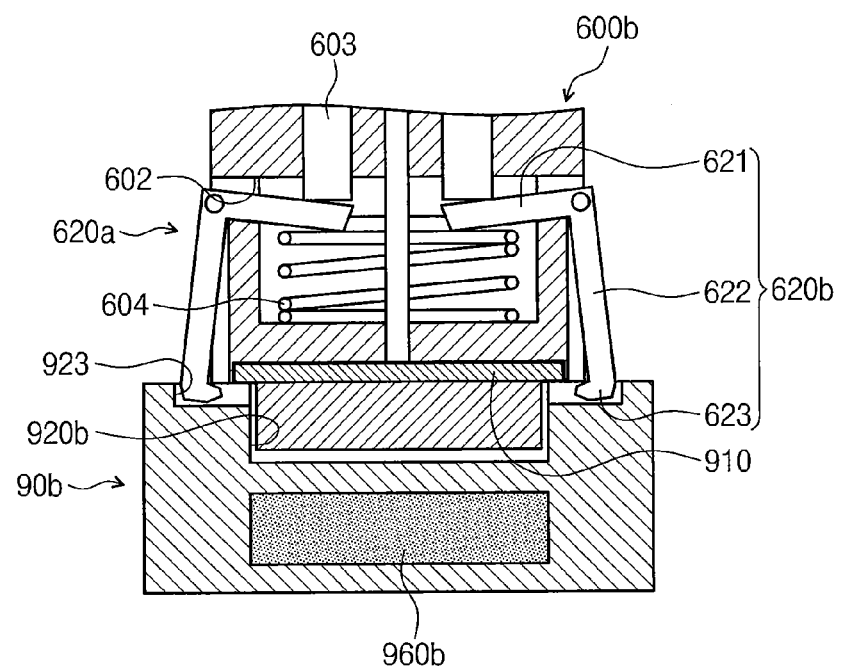
FIG. 22 is a schematic view illustrating when a bonding member of FIG. 21 picks up a collet.

FIG. 21 is a cross-sectional view of a bonding member and a collet buffer member according to another embodiment of the inventive concept and FIG. 22 is a view illustrating when the bonding member of FIG. 21 picks up a collet.

Referring to FIGS. 21 and 22, at least two fixing members 620a and 620b may be provided. The fixing members 620a and 620b are rotatably coupled to a bonding member 600b, so that a collet 910 is fixed at the bonding member 600b by applying pressure on the outer surface of the collet 910.

The fixing hooks 620a and 620b may be disposed spaced apart from each other on the outer circumference or outer surface of the bonding member 600b. For example, the two fixing hooks 620a and 620b may be disposed facing each other on opposite sides of the bonding member 600b. Additionally, at least three fixing hooks similar to 620a and 620b may be disposed spaced apart an equal interval from each other on the outer circumference of the bonding member 600b.

The fixing hooks 620a and 620b each include a first rotating part 621 and a second rotating part 622.

The first rotating part 621 is disposed in a receiving space 602 formed in the bonding member 600b. The receiving space 602 may be provided as a hole or channel extending to the side of the bonding member 600b. A pressing member 603 and an elastic member 604 are disposed inside the bonding member 600b. The pressing member 603 is disposed above the first rotating part 621, so that it may press the first rotating part 621 downwardly. As one example, the pressing member 603 may be provided as a rod that has a lower end disposed in the receiving space 602 and is movable vertically. Additionally, the pressing member 603 may be provided as a hole or channel that is in communication with the receiving space 602 and configured to receive injected gas. The elastic member 604 is disposed below the first rotating part 621, so that it may push the first rotating part 621 upwardly.

The second rotating part 622 extends downwardly at the end of the first rotating part 621 along the outer surface of the bonding member 600b such that the first rotating part 621 and the second rotating part 622 are rotatably and axially coupled to the bonding member 600b. The bottom end of the second rotating part 622 may be disposed below the bottom of the bonding member 600b. A latching part 623 extending toward the center of the bonding member 600b is at the bottom of the second rotating part 622. The top of the latching part 623 may contact the bottom of the bonding member 600*b*.

While the bonding member 600*b* and the receiving groove or channel 920*b* are arranged vertically, as the pressing member 603 presses the fixing hooks 620*a* and 620*b*, the collet 910 may be separated from the bonding member 600*b* and may then be received in the receiving groove 920*b*.

An auxiliary groove or channel 923 is formed at the top of the collet buffer member 90*b*. The auxiliary groove 923 is formed extending outwardly from the side of the receiving groove 920*b*. When the bonding member 600*b* is aligned with the collet 910 to be attached, the auxiliary groove 923 is aligned with the bottom end of the second rotating part 622 and the latching part 623. A magnet 960*b* provided with the collet buffer member 90*b* is identical to the magnet 960 provided with the collet buffer member 90 of FIG. 10 and thus overlapping descriptions are omitted in the interest of brevity.

The bonding member 600*b* descends vertically to the receiving groove 920*b* so as to pick up the collet 910. At this point, the pressing member 603 applies pressure on the fixing hooks 620*a* and 620*b*, so that the bottom ends of the fixing hooks 620*a* and 620*b* spread outwardly. After the fixing hooks 620*a* and 620*b* descend to the auxiliary groove 923, the pressing member 603 stops pressing the fixing hooks 620*a* and 620*b*, the bottom ends of the fixing hooks 620*a* and 620*b* rotate inwardly and apply pressure on the side of the collet 910, so that the collet 910 is fixed to the bonding member 600*b*.

Additionally, the collet 910 may have an upper or top portion inserted into the fixing groove 601 and a lower or bottom portion, which portions may have a stepped difference. Accordingly, the fixing hooks 620*a* and 620*b* may be hooked at the top and bottom portions of the collet 910 inserted to the fixing groove 601 and the side of the collet 910.

According to an embodiment of the inventive concept, a die may be attached to a substrate efficiently.

Additionally, according to an embodiment of the inventive concept, a die ejector may be replaced.

Furthermore, according to an embodiment of the inventive concept, a collet may be replaced.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A die bonding device comprising:
    a wafer holder supporting a wafer on which a die is formed;
    an ejector holder disposed at an inner portion of the wafer holder and below the wafer and supporting a die ejector in a vertical orientation, the die ejector configured to help separate the die from the wafer;
    a support unit supporting a substrate on which the separated die is to be attached;
    a bonding unit configured to pick up the separated die from the wafer and attach the picked-up die to the substrate;
    an ejector buffer unit configured to receive the die ejector, wherein the ejector buffer unit is horizontally spaced apart from the wafer holder, and wherein the ejector buffer unit comprises a plate shaped ejector buffer member including at least one fixing member configured to receive the die ejector and hold the die ejector in the vertical orientation at the ejector buffer member; and
    a replacing unit configured to transfer the die ejector between the ejector holder and the ejector buffer unit.

2. The device of claim 1, wherein the fixing member protrudes from a top of the ejector buffer member and includes an electromagnet.

3. The device of claim 1, wherein the fixing member is provided as a recess formed at a top of the ejector buffer member.

4. The device of claim 1, wherein the fixing member comprises a plurality of fixing hooks each comprising a latch member configured to be received in a recess of the die ejector so as to fix the die ejector at the ejector buffer unit.

5. The device of claim 1, wherein the ejector buffer unit further comprises a check member disposed adjacent to the ejector buffer member and configured to check a type of the die ejector disposed at the fixing member or to check whether the fixing member is empty.

6. The device of claim 1, wherein the replacing unit is configured to:
    remove the die ejector from the ejector holder, transfer the die ejector away from the ejector holder and toward the ejector buffer unit with the die ejector in the vertical orientation, and place the die ejector on the at least one fixing member in the vertical orientation; and
    remove the die ejector from the at least one fixing member, transfer the die ejector away from the ejector buffer unit and toward the ejector holder with the die ejector in the vertical orientation, and place the die ejector on the ejector holder in the vertical orientation,
    and wherein the replacing unit comprises:
    a movable replacing body;
    at least one finger configured to pick up the die ejector; and
    an arm movably connecting the finger to the replacing body.

7. The device of claim 1, wherein the replacing unit is configured to:
    remove the die ejector from the ejector holder, transfer the die ejector away from the ejector holder and toward the ejector buffer unit with the die ejector in the vertical orientation, and place the die ejector on the at least one fixing member in the vertical orientation; and
    remove the die ejector from the at least one fixing member, transfer the die ejector away from the ejector buffer unit and toward the ejector holder with the die ejector in the vertical orientation, and place the die ejector on the ejector holder in the vertical orientation,
    and wherein the replacing unit comprises:
    a movable replacing body;
    a pickup channel configured to receive the die ejector formed in the replacing body; and
    an electromagnet in the replacing body adjacent to the pickup channel.

8. A die bonding device comprising:
    a wafer holder supporting a wafer on which a die is formed;
    an ejector holder disposed at the wafer holder below the wafer and supporting a die ejector in a vertical orientation, the die ejector configured to help separate the die from the wafer;

a support unit supporting a substrate on which the separated die is to be attached;

a bonding unit configured to pick up the separated die from the wafer and attach the picked-up die to the substrate, the bonding unit comprising a bonding member holding a collet at a bottom portion thereof such that the picked-up die contacts the collet;

an ejector buffer unit configured to receive the die ejector, wherein the ejector buffer unit is horizontally spaced apart from the wafer holder, and wherein the ejector buffer unit comprises a plate shaped ejector buffer member including a plurality of fixing members each configured to receive the die ejector and hold the die ejector in the vertical orientation at the ejector buffer member; and a replacing unit configured to transfer the die ejector between the ejector holder and the ejector buffer unit with the die ejector in the vertical orientation, wherein the replacing unit comprises:
 a movable replacing body; and
 a pickup member configured to pick up the die ejector and configured to fix the die ejector at the replacing body, and wherein the replacing body is configured to move in a vertical direction to adjust a vertical position of the pickup member and configured to move in a horizontal direction to move the pickup member in the vertical position on a horizontal plane.

9. The device of claim 8, wherein the die bonding device further comprises a collet buffer member comprising a collet receiving recess configured to receive the collet from the bonding unit.

10. The device of claim 9, wherein the receiving recess comprises a first receiving portion and a second receiving portion that intersects the first receiving portion, each sized and configured to receive differently sized collets.

11. The device of claim 9, wherein a test unit is disposed on the collet buffer member, the test unit configured to measure a horizontal degree of the collet that is held by the bonding unit.

12. The device of claim 9, wherein the collet buffer member comprises a plurality of receiving recesses, and wherein a jig having a shape corresponding to the collet and having a hardness greater than the collet is disposed at one of the receiving recesses.

13. The device of claim 9, wherein the collet buffer member comprises a magnet disposed adjacent to the receiving recess.

14. The device of claim 8, wherein the bonding member is movable and comprises an electromagnet disposed at a bottom portion thereof configured to detach the collet from the bonding member.

15. The device of claim 8, wherein the bonding member is movable and comprises fixing hooks rotatably coupled to the bonding member and configured to apply pressure on an outer surface of the collet to fix the collet to the bonding member.

16. A die bonding device comprising:
a wafer holder supporting a wafer comprising a die;
an ejector holder holding a die ejector in a vertical orientation below the die, the die ejector configured to separate the die from the wafer;
a support unit supporting a substrate;
a bonding unit configured to pick up the separated die from the wafer and attach the picked-up die to the substrate;
an ejector buffer unit configured to receive the die ejector, wherein the ejector buffer unit is horizontally spaced apart from the wafer holder, and wherein the ejector buffer unit comprises a plate shaped ejector buffer member including a plurality of fixing members each configured to receive the die ejector and hold the die ejector in the vertical orientation at the ejector buffer member; and
a replacing unit configured to:
 remove the die ejector from the ejector holder, transfer the die ejector away from the ejector holder and toward the ejector buffer unit with the die ejector in the vertical orientation, and place the die ejector on one of the plurality of fixing members in the vertical orientation; and
 remove the die ejector from one of the plurality of fixing members, transfer the die ejector away from the ejector buffer unit and toward the ejector holder with the die ejector in the vertical orientation, and place the die ejector on the ejector holder in the vertical orientation,
wherein the replacing unit comprises:
 a movable replacing body; and
 a pickup member configured to pick up the die ejector and configured to fix the die ejector at the replacing body, and
wherein the replacing body is configured to move in a vertical direction to adjust a vertical position of the pickup member and configured to move in a horizontal direction to move the pickup member in the vertical position on a horizontal plane.

17. The device of claim 16, wherein the pickup member is configured to attach the die ejector to the replacing unit with the die ejector in the vertical orientation.

18. The device of claim 17, wherein the pickup member comprises a plurality of fingers movably attached to the replacing body, each of the fingers sized and configured to be received in a respective recess formed in the die ejector.

19. The device of claim 17, wherein a channel is formed in a bottom portion of the replacing body that is sized and configured to receive a top portion of the die ejector and wherein the pickup member comprises an electromagnet in the replacing body and adjacent the channel.

20. The device of claim 1, wherein the ejector buffer member comprises a plurality of fixing members disposed at an outer periphery thereof, and wherein the ejector buffer member is rotatable to adjust the position of the plurality of fixing members.

* * * * *